United States Patent
Lee et al.

(10) Patent No.: US 8,932,908 B2
(45) Date of Patent: Jan. 13, 2015

(54) SEMICONDUCTOR DEVICE AND METHOD OF FORMING PARTIALLY-ETCHED CONDUCTIVE LAYER RECESSED WITHIN SUBSTRATE FOR BONDING TO SEMICONDUCTOR DIE

(71) Applicant: STATS ChipPAC, Ltd., Singapore (SG)

(72) Inventors: KyuWon Lee, Kyoungki-Do (KR); HyunSu Shin, Incheon (KR); Hun Jeong, Seoul (KR); JinGwan Kim, Seoul (KR); SunYoung Chun, Kyoungki-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/896,635

(22) Filed: May 17, 2013

(65) Prior Publication Data

US 2013/0249090 A1    Sep. 26, 2013

Related U.S. Application Data

(60) Continuation of application No. 13/606,631, filed on Sep. 7, 2012, now Pat. No. 8,502,392, which is a division of application No. 12/951,399, filed on Nov. 22, 2010, now Pat. No. 8,288,202.

(51) Int. Cl.
*H01L 21/44* (2006.01)
*H01L 21/48* (2006.01)
(Continued)

(52) U.S. Cl.
CPC .............. *H01L 21/52* (2013.01); *H01L 21/563* (2013.01); *H01L 24/16* (2013.01); *H01L 24/17* (2013.01); *H01L 24/81* (2013.01); *H01L 24/94* (2013.01); *H01L 25/105* (2013.01); *H01L 25/50* (2013.01); *H01L 23/48* (2013.01); *H01L 24/10* (2013.01); *H01L 23/3128* (2013.01); *H01L 2224/13099* (2013.01); *H01L 2224/16145* (2013.01); *H01L 2224/16225* (2013.01); *H01L 2224/1718* (2013.01); *H01L 2224/73204* (2013.01); *H01L 2224/83102* (2013.01); *H10L 2224/92125* (2013.01); *H01L 2224/94* (2013.01); *H01L 2225/1023* (2013.01);
(Continued)

(58) Field of Classification Search
USPC .......................... 438/107; 257/774, E21.499
See application file for complete search history.

(56) References Cited

U.S. PATENT DOCUMENTS

| | | |
|---|---|---|
| 5,541,450 A | 7/1996 | Jones et al. |
| 6,930,257 B1 | 8/2005 | Hiner et al. |

(Continued)

*Primary Examiner* — Phuc Dang
(74) *Attorney, Agent, or Firm* — Robert D. Atkins; Patent Law Group: Atkins and Associates, P.C.

(57) ABSTRACT

A semiconductor device has a substrate with a die attach area. A conductive layer is formed over a surface of the substrate and extending below the surface. An insulating layer is formed over the surface of the substrate outside the die attach area. A portion of the conductive layer is removed within the die attach area to expose sidewalls of the substrate. The remaining portion of the conductive layer is recessed below the surface of the substrate within the die attach area. A semiconductor die has bumps formed over its active surface. The semiconductor die is mounted to the substrate by bonding the bumps to the remaining portion of the first conductive layer recessed below the first surface of the substrate. The sidewalls of the substrate retain the bumps during bonding to the remaining portion of the conductive layer. An encapsulant is deposited between the semiconductor die and substrate.

30 Claims, 7 Drawing Sheets

(51) Int. Cl.
*H01L 21/50* (2006.01)
*H01L 21/52* (2006.01)
*H01L 21/56* (2006.01)
*H01L 23/00* (2006.01)
*H01L 25/10* (2006.01)
*H01L 25/00* (2006.01)
*H01L 23/48* (2006.01)
*H01L 23/31* (2006.01)

(52) U.S. Cl.
CPC ............ *H01L 2225/1058* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01079* (2013.01); *H01L 2924/01082* (2013.01); *H01L 2924/15311* (2013.01); *H01L 2924/15331* (2013.01); *H01L 2224/32225* (2013.01); *H01L 2924/0105* (2013.01); *H01L 2924/01074* (2013.01); *H01L 2924/01322* (2013.01); *H01L 2924/014* (2013.01); *H01L 2924/13091* (2013.01); *H01L 2224/48091* (2013.01); *H01L 2224/73265* (2013.01)

USPC .......................... 438/107; 438/125; 257/774

(56) References Cited

U.S. PATENT DOCUMENTS

| | | | |
|---|---|---|---|
| 7,057,284 B2 | 6/2006 | Chauhan et al. | |
| 7,297,562 B1 | 11/2007 | Huemoeller et al. | |
| 7,399,661 B2 | 7/2008 | Hiner et al. | |
| 7,589,398 B1 | 9/2009 | Huemoeller et al. | |
| 7,752,752 B1 | 7/2010 | Rusli et al. | |
| 8,072,764 B2 * | 12/2011 | Yeates et al. | 361/748 |
| 2006/0118970 A1 * | 6/2006 | Ida et al. | 257/782 |
| 2007/0228564 A1 * | 10/2007 | Kim | 257/738 |
| 2009/0020319 A1 * | 1/2009 | Yamada | 174/255 |
| 2009/0179318 A1 * | 7/2009 | Chen | 257/686 |
| 2009/0275191 A1 * | 11/2009 | Weiss et al. | 438/601 |
| 2010/0013047 A1 * | 1/2010 | Thies et al. | 257/532 |
| 2010/0059866 A1 | 3/2010 | Jang et al. | |
| 2010/0075462 A1 * | 3/2010 | Lo | 438/110 |
| 2010/0171207 A1 * | 7/2010 | Shen et al. | 257/686 |
| 2011/0003468 A1 * | 1/2011 | Song | 438/589 |
| 2011/0068449 A1 * | 3/2011 | Kook | 257/676 |
| 2011/0193199 A1 * | 8/2011 | Filippi et al. | 257/621 |
| 2012/0043672 A1 | 2/2012 | Cho et al. | |
| 2012/0049322 A1 | 3/2012 | Su et al. | |

* cited by examiner

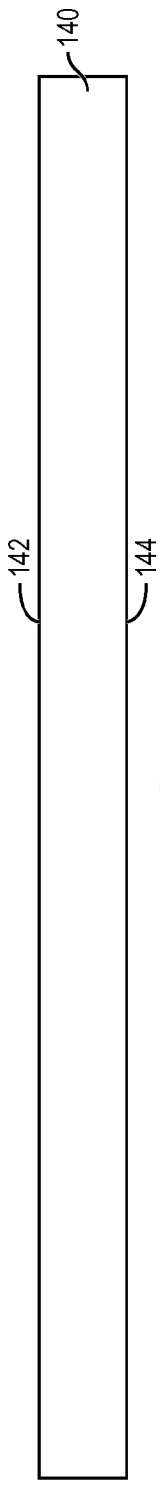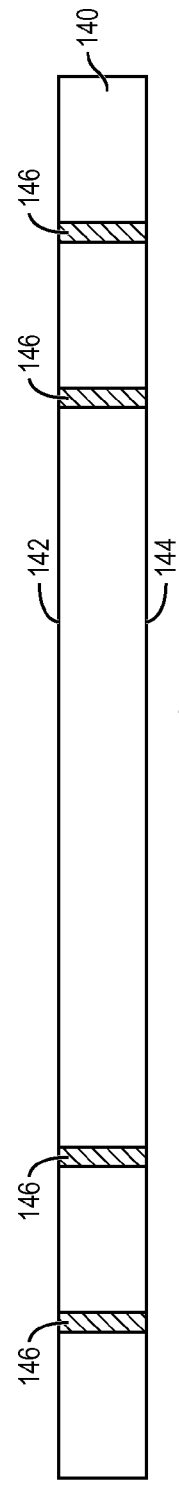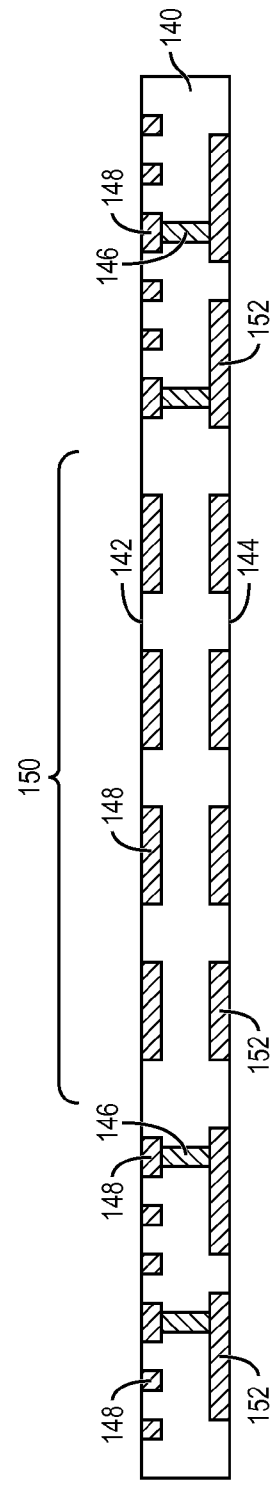

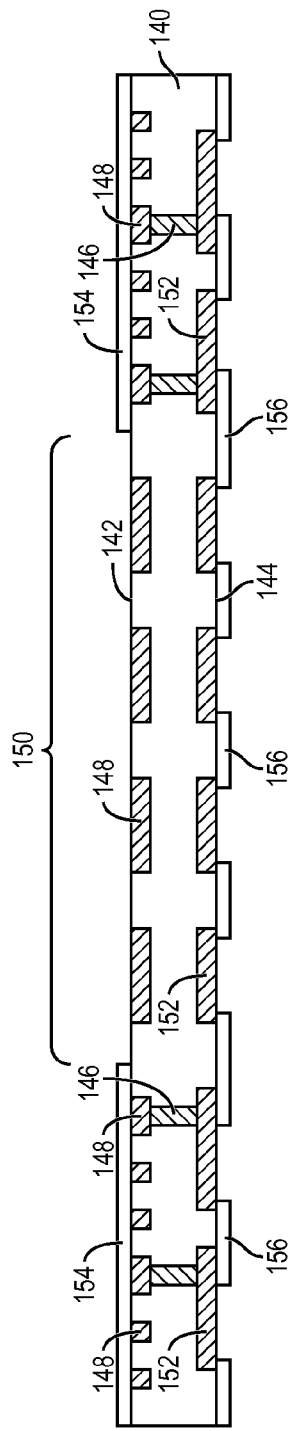
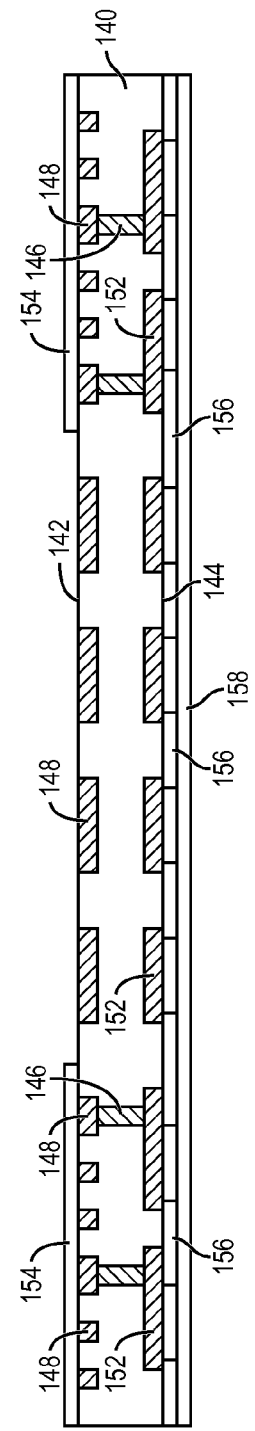
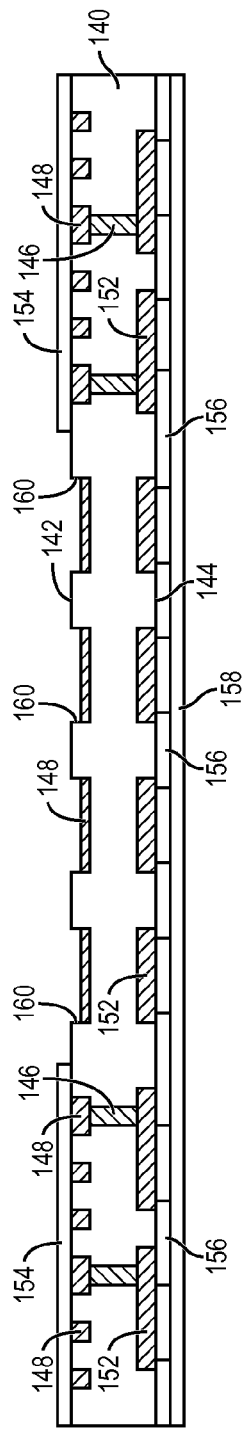

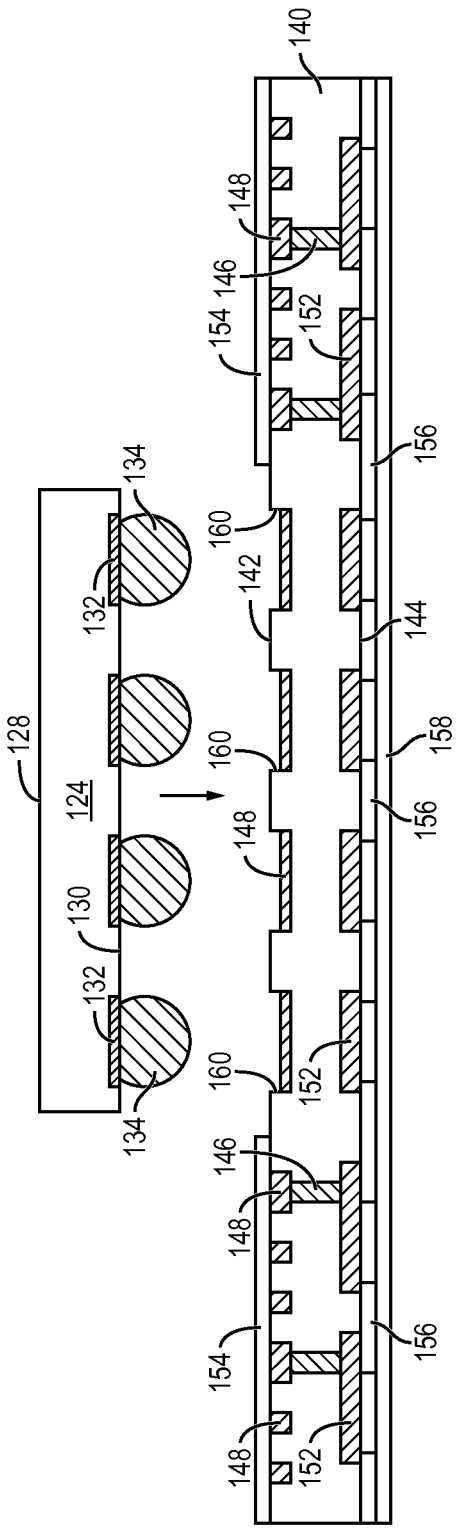
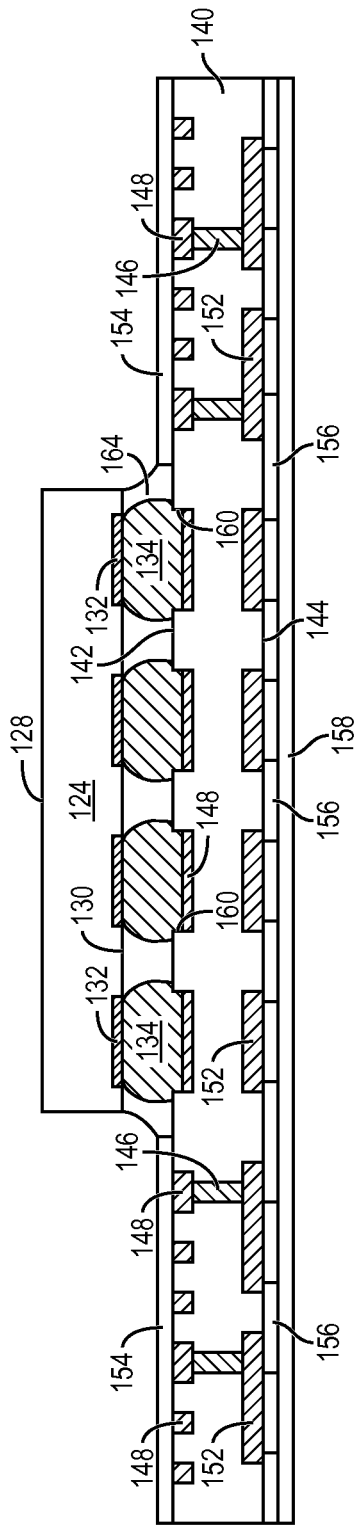
FIG. 4g
FIG. 4h

SEMICONDUCTOR DEVICE AND METHOD OF FORMING PARTIALLY-ETCHED CONDUCTIVE LAYER RECESSED WITHIN SUBSTRATE FOR BONDING TO SEMICONDUCTOR DIE

CLAIM TO DOMESTIC PRIORITY

The present application is a continuation of U.S. patent application Ser. No. 13/606,631, filed Sep. 7, 2012, now U.S. Pat. No. 8,502,392, which is a division of U.S. patent application Ser. No. 12/951,399, now U.S. Pat. No. 8,288,202, filed Nov. 22, 2010, which applications are incorporated herein by reference.

FIELD OF THE INVENTION

The present invention relates in general to semiconductor devices and, more particularly, to a semiconductor device and method of forming a partially-etched conductive layer recessed within a substrate for bonding to a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-couples devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many semiconductor devices, a semiconductor die is mounted to interconnect sites on a substrate by reflowing bumps to form a metallurgical and electrical interconnect. A solder resist layer is typically formed over the interconnect sites on the substrate with solder registration opening (SRO) to contain bump material during reflow. The SRO tends to limit efforts in reducing the bump pitch and increasing input/output (I/O) count for a semiconductor die.

SUMMARY OF THE INVENTION

A need exists to reduce bump pitch and increase I/O count for a semiconductor die. Accordingly, in one embodiment, the present invention is a method of making a semiconductor device comprising the steps of providing a substrate, forming a first conductive layer recessed below a first surface of the substrate, and disposing a semiconductor die over the substrate and electrically coupled to the first conductive layer.

In another embodiment, the present invention is a method of making a semiconductor device comprising the steps of providing a substrate, and forming a first conductive layer recessed below a first surface of the substrate.

In another embodiment, the present invention is a semiconductor device comprising a substrate and first conductive layer recessed below a first surface of the substrate.

In another embodiment, the present invention is a semiconductor device comprising a substrate and first conductive layer recessed below a first surface of the substrate. A semiconductor die is disposed over the substrate and electrically coupled to the first conductive layer.

BRIEF DESCRIPTION OF THE DRAWINGS

FIGS. 4a-4i illustrate a process of forming a partially-etched conductive layer recessed within a substrate for bonding to a semiconductor die.

DETAILED DESCRIPTION OF THE DRAWINGS

Figure 1:
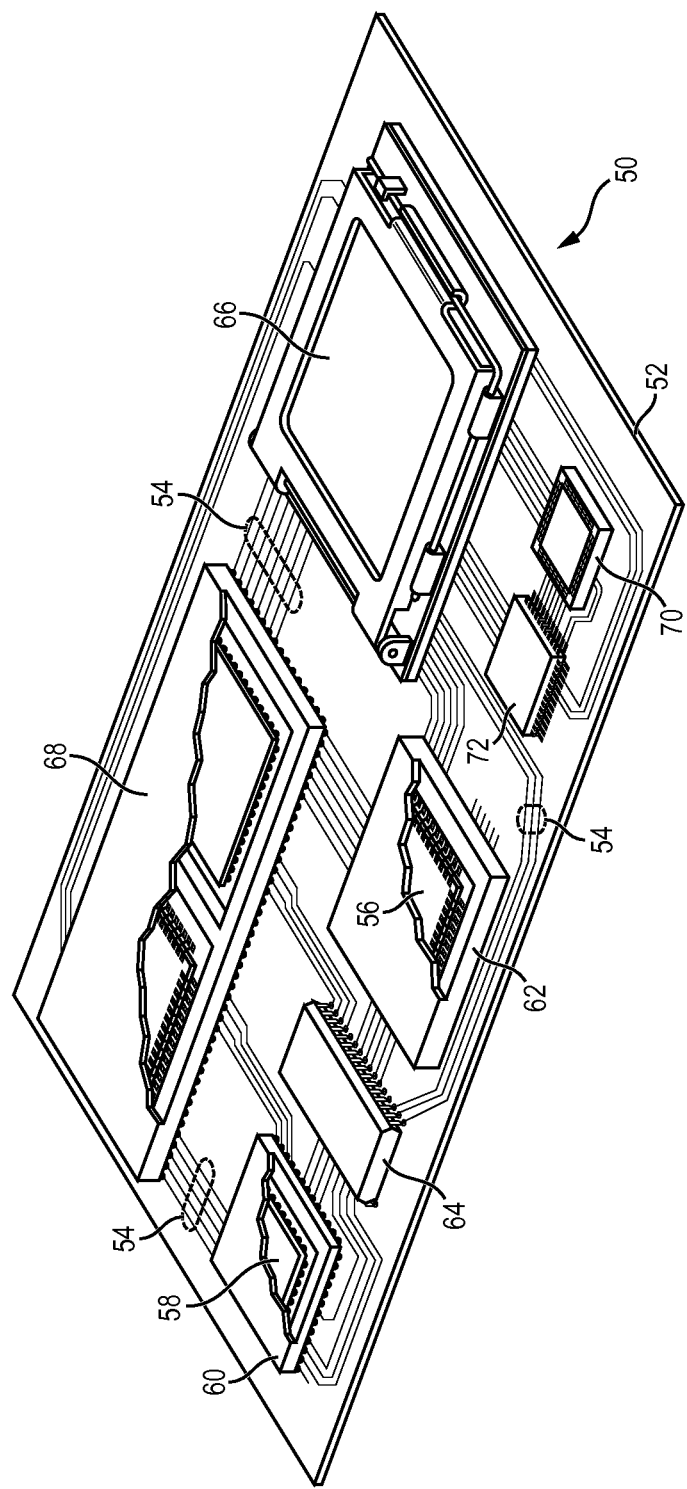
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
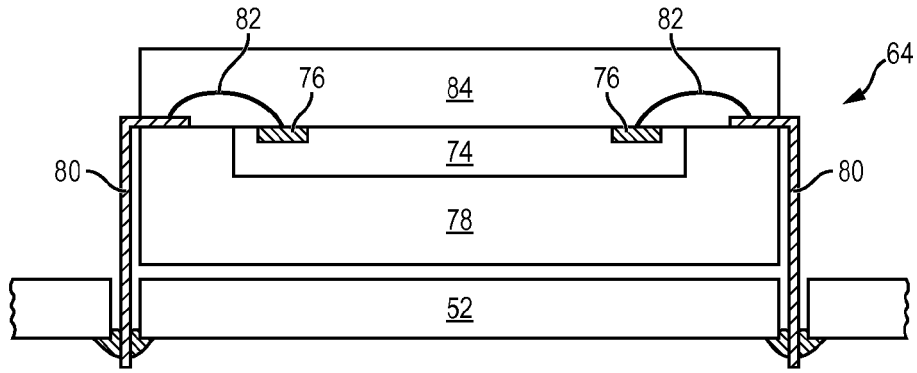
FIGS. 2a-2c illustrate further detail of the representative semiconductor packages mounted to the PCB.
Figure 2B:
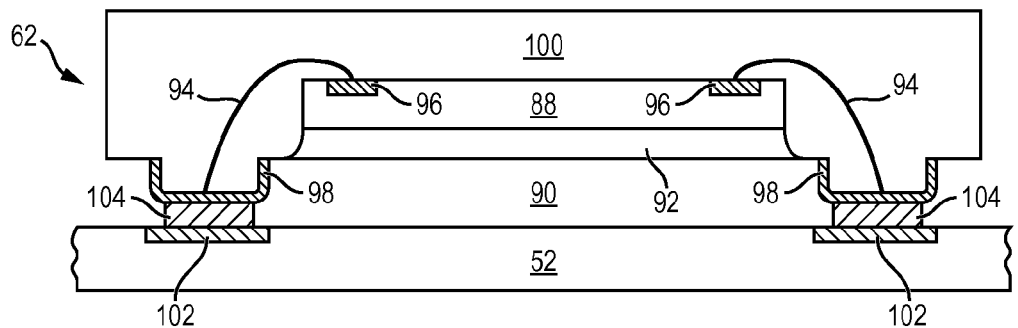
Figure 2C:
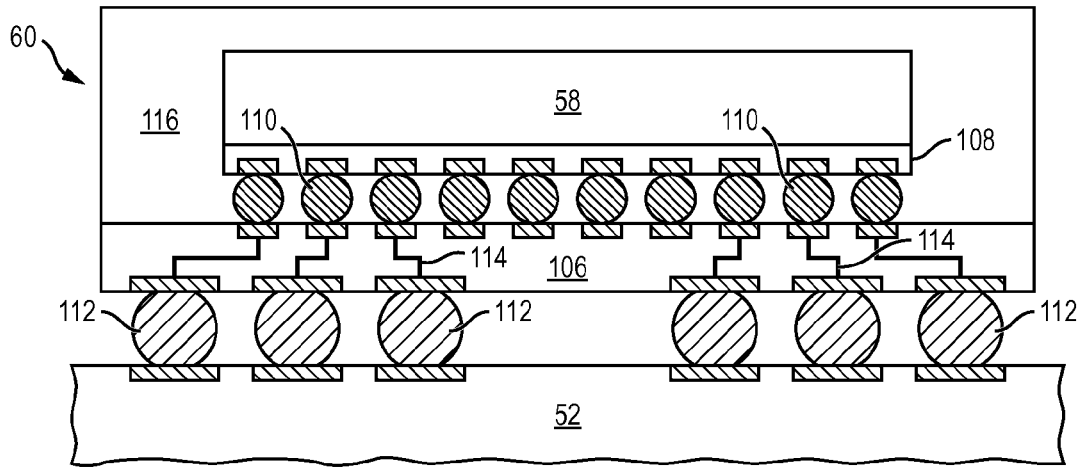

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
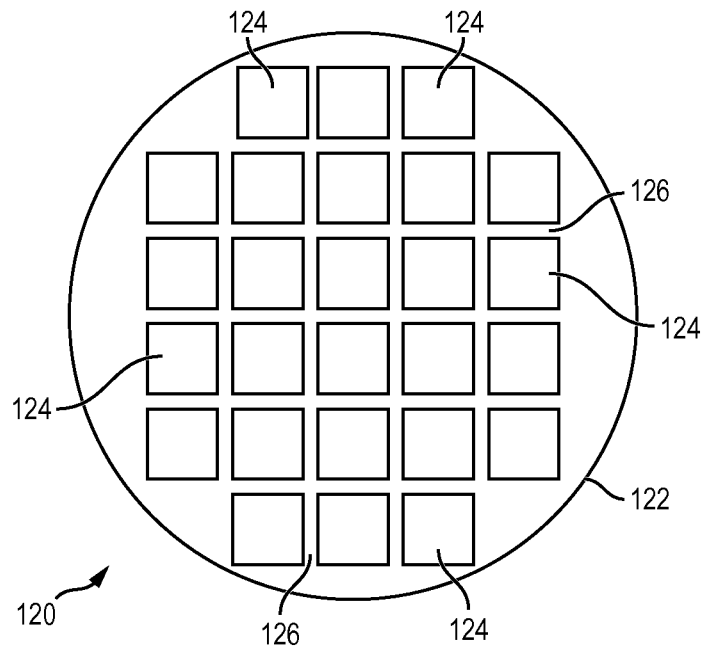
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
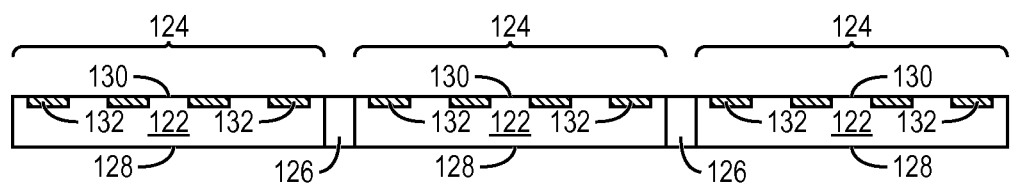

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form spherical balls or bumps 134. In some applications, bumps 134 are reflowed a second time to improve electrical contact to contact pads 132. The bumps can also be compression bonded to contact pads 132. Bumps 134 represent one type of interconnect structure that can be formed over contact pads 132. The interconnect structure can also use stud bump, micro bump, conductive pillars, or other electrical interconnect. Bumps 134 are electrically connected through contact pads 132 to circuits contained in active surface 130.

Figure 3C:
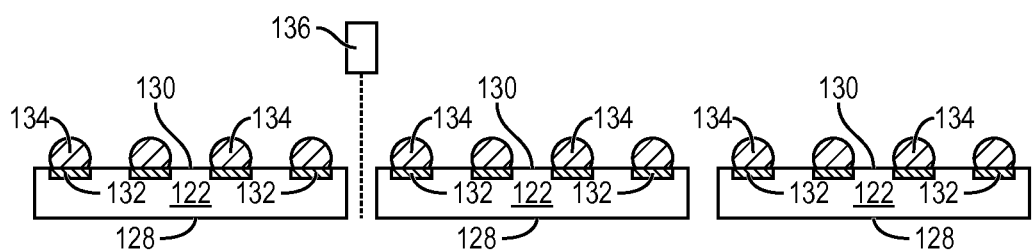

In FIG. 3c, semiconductor wafer 120 is singulated through saw street 126 using a saw blade or laser cutting tool 136 into individual semiconductor die 124.

Figure 4I:
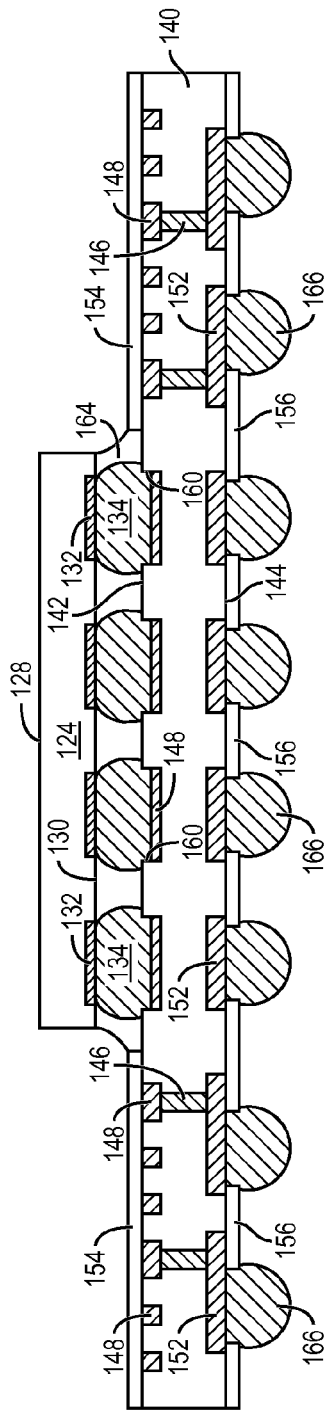

FIGS. 4a-4i illustrate, in relation to FIGS. 1 and 2a-2c, a process of forming a partially-etched conductive layer recessed within a substrate for bonding to a semiconductor die. In FIG. 4a, a semiconductor wafer or substrate 140 contains a base material, such as silicon, germanium, gallium arsenide, indium phosphide, or silicon carbide, for structural support. Substrate 140 can contain embedded semiconductor die, semiconductor components, or passive devices. Substrate 140 has surface 142 and opposing surface 144.

In FIG. 4b, a plurality of vias is formed through substrate 140 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

In FIG. 4c, an electrically conductive layer or RDL 148 is formed over surface 142 of substrate 140 and conductive vias 146 using a patterning and metal deposition process such as printing, PVD, CVD, sputtering, electrolytic plating, and electroless plating. Conductive layer 148 can be one or more layers of Al, Cu, Sn, Ni, Au, Ag, or other suitable electrically conductive material. Conductive layer 148 extends below surface 142 with electrical connection to conductive vias 146. Conductive layer 148 is initially made thick, e.g., 6 micrometers (μm), particular in die attach area 150 designated for later mounting of semiconductor die 124.

An electrically conductive layer or RDL 152 is formed over surface 144 of substrate 140 and conductive vias 146 using a patterning and metal deposition process such as printing, PVD, CVD, sputtering, electrolytic plating, and electroless plating. Conductive layer 152 can be one or more layers of Al, Cu, Sn, Ni, Au, Ag, or other suitable electrically conductive material. Conductive layer 152 is electrically connected to conductive vias 146.

In FIG. 4d, a solder resist or insulating layer 154 is formed over surface 142 of substrate 140 and conductive layer 148 using PVD, CVD, printing, spin coating, spray coating, sintering or thermal oxidation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 154 is removed by an etching process over die attach area 150 for bonding of semiconductor die 124 to conductive layer 148.

A solder resist or insulating layer 156 is formed over surface 144 of substrate 140 and conductive layer 152 using PVD, CVD, printing, spin coating, spray coating, sintering or thermal oxidation. The insulating layer 156 contains one or more layers of SiO2, Si3N4, SiON, Ta2O5, Al2O3, or other material having similar insulating and structural properties. A portion of insulating layer 156 is removed by an etching process to expose conductive layer 152.

In FIG. 4e, an insulating layer 158 is formed over insulating layer 156 and conductive layer 152 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. In one embodiment, insulating layer 158 is a dry film layer.

In FIG. 4f, a portion of conductive layer 148 within die attach area 150 is removed a wet etching process (immersion or spray) or dry etching process (physical sputtering, plasma, reactive ion etching). In one embodiment, the thickness of conductive layer 148 within die attach area 150 is reduced by 50 percent or 10-20 μm. The etchant does not react with substrate 140 or insulating layer 154. Accordingly, removing a portion of conductive layer 148 leaves a recess in substrate 140 below surface 142. The sidewalls of the recessed substrate 140, i.e., between the remaining partially-etched conductive layer 148 and surface 142, constitute a prepreg wall 160. The portion of conductive layer 148 outside die attach area 150 remains intact by nature of insulating layer 154. Likewise, insulating layer 158 protects conductive layer 152 from the etching process.

In FIG. 4g, semiconductor die 124 from FIGS. 3a-3c are positioned over and mounted to substrate 140 using a pick and place operation. The partially-etched conductive layer 148 is substantially the same width or slightly wider than bumps 134. Bumps 134 are metallurgically and electrically connected to the partially-etched conductive layer 148 by reflow and pressure. A force can be applied to back surface 128 of semiconductor die 124 to assist with the bump bonding. The recessed substrate 140 aids with alignment of bumps 134 to conductive layer 148.

FIG. 4h shows semiconductor die 124 mounted to substrate 140. Bumps 134 reside partially within the recessed substrate 140 and contact the partially-etched conductive layer 148, as well as prepreg walls 160. By disposing bumps 134 partially within the recessed substrate, the combined height of semiconductor die 124 and substrate 140 is reduced. The roughness of substrate 140 strengths the bond between semiconductor die 124 and the substrate. The recessed substrate 140 with prepreg walls 160 is well suited for fine bump pitch and high I/O count semiconductor die. Prepreg walls 160 act as a mask or barrier to restrain outward flow of bump material during reflow to reduce occurrences of bump bridging or electrical shorting between adjacent structures.

In high routing density applications, it is desirable to minimize escape pitch of conductive layer 148. The escape pitch between conductive layer 148 can be reduced by eliminating the masking layer for the purpose of reflow containment, i.e., by reflowing the bump material without a masking layer. Since no solder registration opening (SRO) is formed around conductive layer 148, the conductive layer can be formed with a finer pitch, i.e., the conductive layer 148 can be disposed closer together or to nearby structures. When the bump material is reflowed without a masking layer to metallurgically and electrically connect contact pad 132 to conductive layer 148, the wetting and surface tension causes the bump material to maintain self-confinement and be retained within the space between the contact pad and conductive layer and portion of substrate 140 immediately adjacent to conductive layer 148 substantially within the footprint of the contact pads.

To achieve the desired self-confinement property, the bump material can be immersed in a flux solution prior to placement on conductive layer 148 to selectively render the region contacted by the bump material more wettable than the surrounding area of the conductive layer. The molten bump material remains confined substantially within the area defined by the contact pad due to the wettable properties of the flux solution. The bump material does not run-out to the less wettable areas. A thin oxide layer or other insulating layer can be formed over areas where bump material is not intended to make the area less wettable. Hence, masking layer 154 is not needed around contact pad 132 or conductive layer 148.

An encapsulant or molding compound 164 is deposited between semiconductor die 124 and substrate 140 using a mold underfill (MUF) process. The encapsulant is injected under pressure from a dispensing needle through the gap under semiconductor die 124 and substrate 140 around bumps 134. A vacuum assist can draw encapsulant 164 to aid with uniform distribution. Encapsulant 164 can be polymer composite material, such as epoxy resin with filler, epoxy acrylate with filler, or polymer with proper filler. Encapsulant 164 is non-conductive and environmentally protects the semiconductor device from external elements and contaminants.

In FIG. 4i, insulating layer 158 is removed by chemical etching or wet stripping to expose conductive layer 152. An electrically conductive bump material is deposited over the exposed portion of conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 166. In some applications, bumps 166 are reflowed a second time to improve electrical contact to conductive layer 152. An under bump metallization (UBM) can be formed under bumps 166. The bumps can also be compression bonded to conductive layer 152. Bumps 166 represent one type of interconnect structure that can be formed over conductive layer 152. The interconnect structure can also use stud bump, micro bump, or other electrical interconnect.

Figure 5:
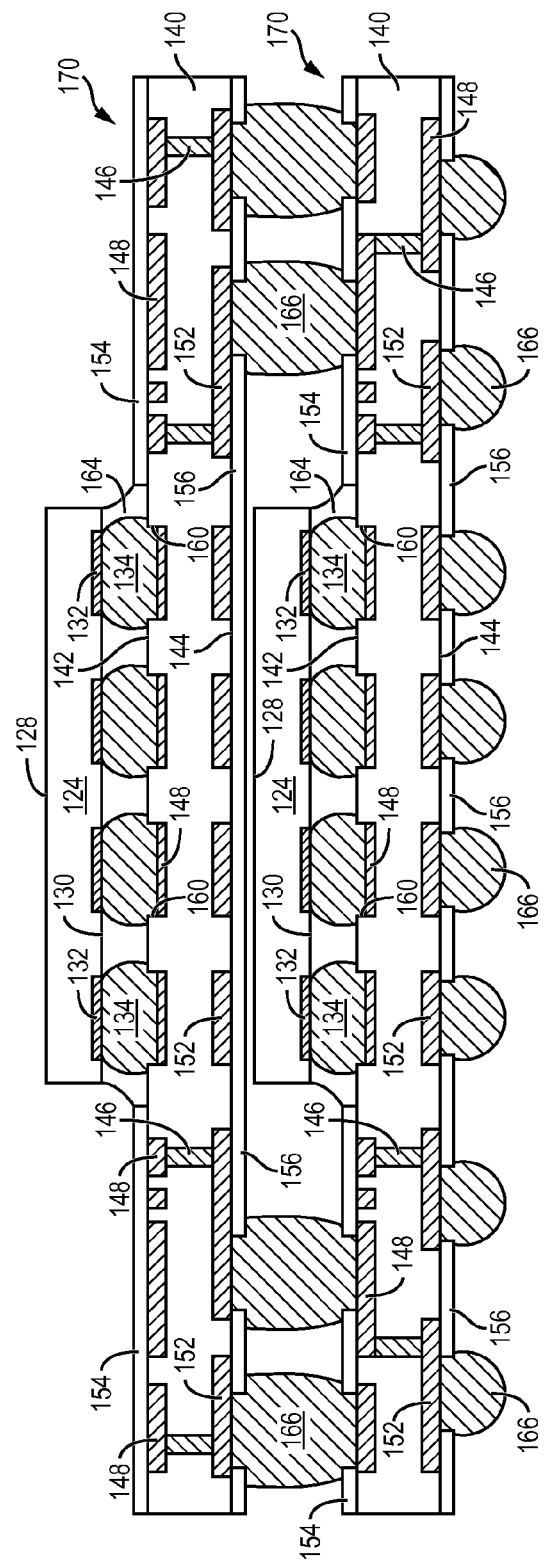
FIG. 5 illustrates stacked semiconductor die bonded to substrate with partially-etched recessed conductive layer.

FIG. 5 shows two stacked semiconductor devices 170, each including semiconductor die 124 and substrate 140. Semiconductor die 124 are electrically connected through bumps 134 and substrate 140. Bumps 134 reside partially within the recessed substrate 140 and contact the partially-etched conductive layer 148, as well as prepreg walls 160. By disposing bumps 134 partially within the recessed substrate, the combined height of semiconductor die 124 and substrate 140 is reduced. The roughness of substrate 140 strengths the bond between semiconductor die 124 and the substrate. The recessed substrate 140 with prepreg walls 160 is well suited for fine bump pitch and high I/O count semiconductor die. Prepreg walls 160 act as a mask to restrain outward flow of bump material during reflow to reduce occurrences of bump bridging or electrical shorting between adjacent structures.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive layer in a first surface of the substrate;
   removing a portion of the first conductive layer to a level below the first surface of the substrate;
   providing a semiconductor die including an interconnect structure formed over a surface of the semiconductor die; and
   disposing the semiconductor die over the substrate with the interconnect structure contacting the first conductive layer and a sidewall of the substrate.

2. The method of claim 1, wherein the interconnect structure includes a bump.

3. The method of claim 1, wherein the first conductive layer is recessed 10-20 micrometers below the first surface of the substrate.

4. The method of claim 1, further including forming an insulating layer over the first surface of the substrate.

5. The method of claim 1, further including depositing an underfill material between the semiconductor die and substrate.

6. The method of claim 1, further including:
   forming a conductive via through the substrate; and
   forming a second conductive layer over a second surface of the substrate.

7. A method of making a semiconductor device, comprising:
   providing a substrate;
   forming a first conductive layer in a first surface of the substrate;
   forming a recessed interconnect site by removing a portion of the first conductive layer to a level below the first surface of the substrate;
   providing a semiconductor die including an interconnect structure formed over a surface of the semiconductor die; and
   disposing the semiconductor die over the substrate with the interconnect structure contacting the recessed interconnect site.

8. The method of claim 7, wherein the interconnect structure contacts a sidewall of the substrate above the recessed interconnect site.

9. The method of claim 7, wherein the interconnect structure includes a bump.

10. The method of claim 7, further including depositing an underfill material between the semiconductor die and substrate.

11. The method of claim 7, wherein the first conductive layer is recessed 10-20 micrometers below the first surface of the substrate.

12. The method of claim 7, further including:
    forming a conductive via through the substrate; and
    forming a second conductive layer over a second surface of the substrate.

13. The method of claim 12, further including
    stacking a plurality of semiconductor devices
    and
    electrically connecting the stacked semiconductor devices through the interconnect structure, first conductive layer, second conductive layer, and conductive via.

14. A semiconductor device, comprising:
    a substrate; and
    an interconnect site formed below a first surface of the substrate, the interconnect site including a first conductive layer etched below the first surface of the substrate to form a recess in the substrate with a sidewall of the recess extending from the etched first conductive layer to the first surface of the substrate.

15. The semiconductor device of claim 14, further including a semiconductor die disposed over the substrate and electrically connected to the interconnect site.

16. The semiconductor device of claim 15, further including a bump disposed between the semiconductor die and the interconnect site.

17. The semiconductor device of claim 15, further including an underfill material deposited between the semiconductor die and substrate.

18. The semiconductor device of claim 14, wherein the first conductive layer is recessed 10-20 micrometers below the first surface of the substrate.

19. The semiconductor device of claim 15, further including:
    a conductive via formed through the substrate; and
    a second conductive layer formed over a second surface of the substrate.

20. The semiconductor device of claim 19, further including:
a plurality of bumps disposed between the semiconductor die and substrate; and
a plurality of stacked semiconductor devices electrically connected through the bumps, first conductive layer, second conductive layer, and conductive via.

21. A semiconductor device, comprising:
a substrate;
an interconnect site formed below a surface of the substrate, the interconnect site including a first conductive layer etched below opposing sidewalls of a recess in the substrate;
a semiconductor die disposed over the substrate; and
an interconnect structure disposed between the semiconductor die and interconnect site.

22. The semiconductor device of claim 21, wherein the interconnect structure contacts the opposing sidewalls of the recess in the substrate.

23. The semiconductor device of claim 21, wherein the first conductive layer is recessed 10-20 micrometers below the surface of the substrate.

24. The semiconductor device of claim 21, further including an insulating layer formed over the surface of the substrate.

25. The semiconductor device of claim 21, further including an underfill material deposited between the semiconductor die and substrate.

26. A method of making a semiconductor device, comprising:
providing a substrate;
forming a first conductive layer in a first surface of the substrate; and
forming an interconnect site for the substrate recessed below the first surface of the substrate by removing a portion of the first conductive layer.

27. The method of claim 26, further including:
providing a semiconductor die including an interconnect structure formed over a surface of the semiconductor die; and
disposing the semiconductor die over the substrate with the interconnect structure contacting the interconnect site.

28. The method of claim 26, further including depositing an underfill material between the semiconductor die and substrate.

29. The method of claim 26, wherein the interconnect structure includes a bump.

30. The method of claim 26, further including:
forming a conductive via through the substrate; and
forming a second conductive layer over a second surface of the substrate.

* * * * *